(12) United States Patent
Lu

(10) Patent No.: US 12,610,481 B2
(45) Date of Patent: Apr. 21, 2026

(54) RECEIVING DEVICE

(71) Applicant: Acer Incorporated, New Taipei City (TW)

(72) Inventor: Ching-Yi Lu, New Taipei City (TW)

(73) Assignee: ACER INCORPORATED, New Taipei City (TW)

( * ) Notice: Subject to any disclaimer, the term of this patent is extended or adjusted under 35 U.S.C. 154(b) by 136 days.

(21) Appl. No.: 18/582,021

(22) Filed: Feb. 20, 2024

(65) Prior Publication Data

US 2024/0314950 A1 Sep. 19, 2024

(30) Foreign Application Priority Data

Mar. 17, 2023 (TW) .................................. 112109996

(51) Int. Cl.
*H05K 5/02* (2006.01)
*H05K 5/03* (2006.01)

(52) U.S. Cl.
CPC ............. *H05K 5/0217* (2013.01); *H05K 5/03* (2013.01)

(58) Field of Classification Search
CPC ....... H05K 5/0017; H05K 5/0217; H05K 5/03
USPC .................................. 361/807, 727, 728, 756
See application file for complete search history.

(56) References Cited

U.S. PATENT DOCUMENTS

| | | | | |
|---|---|---|---|---|
| 6,508,402 B1 * | 1/2003 | Takada | ................... | G06K 13/08 |
| | | | | 235/475 |
| 2003/0068927 A1 * | 4/2003 | Weng | ................ | H01R 13/6315 |
| | | | | 439/188 |
| 2004/0005799 A1 * | 1/2004 | Okabe | ................ | G06K 13/0856 |
| | | | | 439/157 |
| 2008/0144259 A1 * | 6/2008 | Sun | ...................... | H05K 5/0295 |
| | | | | 361/807 |

FOREIGN PATENT DOCUMENTS

| | | | | | |
|---|---|---|---|---|---|
| CN | 1783589 A | * | 6/2006 | ............ | G06K 17/00 |
| EP | 1145092 B1 | | 4/2003 | | |
| TW | 580156 U | | 3/2004 | | |
| TW | M401841 U | | 4/2011 | | |
| TW | I360737 B | | 3/2012 | | |
| TW | 201501036 A | * | 1/2015 | ............ | G06K 17/00 |

* cited by examiner

*Primary Examiner* — Hung S. Bui
(74) *Attorney, Agent, or Firm* — Birch, Stewart, Kolasch & Birch, LLP

(57) ABSTRACT
A receiving device is provided in this disclosure. The receiving device comprises a housing, a slider, an interface component and a first elastic component. The slider is movably arranged on the housing. The interface component is disposed on the housing. The first elastic component is connected between the housing and the slider. In response to an external device entering the housing, the slider is contacted by the external device to slide until the external device is connected to the interface component. In response to the external device in the housing is pushed by an external force, the first elastic component provides an elastic force to make the slider slide in reverse, and the slider pushes against the external device to withdraw the external device from the housing.

9 Claims, 4 Drawing Sheets

RECEIVING DEVICE

This application claims the benefit of Taiwan application Serial No. 112109996, filed Mar. 17, 2023, the subject matter of which is incorporated herein by reference.

TECHNICAL FIELD

The invention relates in general to a receiving device, and more particularly to a receiving device applicable to an external device.

BACKGROUND

Generally speaking, after an external device (such as an external hard disc) is inserted to a corresponding receiving device, if the user would like to withdraw the external device from the receiving device with a conventional design, the user can only withdraw the external device using tools or by applying an extensive manual force. This is not only time consuming but also physique demanding. Therefore, it has become a prominent task for the industry to provide an improved receiving device which can save time and effort.

SUMMARY

The invention is directed to a receiving device. Through the design of movable actuation of the slider and the elastic component in the housing, the user can easily insert the external device into the receiving device or withdraw the external device from the receiving device, and the operation is made more convenient and effortless.

According to one embodiment of the present invention, a receiving device is provided. The receiving device comprises a housing, a slider, an interface component and a first elastic component. The slider is movably arranged on the housing. The interface component is disposed on the housing. The first elastic component is connected between the housing and the slider. In response to an external device entering the housing, the slider is contacted by the external device to slide until the external device is connected to the interface component. In response to the external device in the housing is pushed by an external force, the first elastic component provides an elastic force to make the slider slide in reverse, and the slider pushes against the external device to withdraw the external device from the housing.

The above and other aspects of the invention will become better understood with regard to the following detailed description of the preferred but non-limiting embodiment (s). The following description is made with reference to the accompanying drawings.

DETAILED DESCRIPTION

Detailed descriptions of each embodiment of the present invention are disclosed below with reference to accompanying drawings. Apart from the said detailed descriptions, any embodiments in which the present invention can be used as well as any substitutions, modifications or equivalent changes of the said embodiments are within the scope of the present invention, and the descriptions and definitions in the claims shall prevail. Specific details and embodiments are disclosed in the specification for anyone ordinary skilled in the art to comprehensively understand the present invention, not for limiting the present invention. Moreover, generally known procedures or elements are not disclosed to avoid adding unnecessary restrictions to the present invention. Unless otherwise specified, element designations common to different drawings can be regarded as corresponding elements. These drawings are for describing the connection relationship between the elements of the embodiments, and the dimension scales used in the accompanying drawings are not based on actual proportion of the elements.

Figure 1:
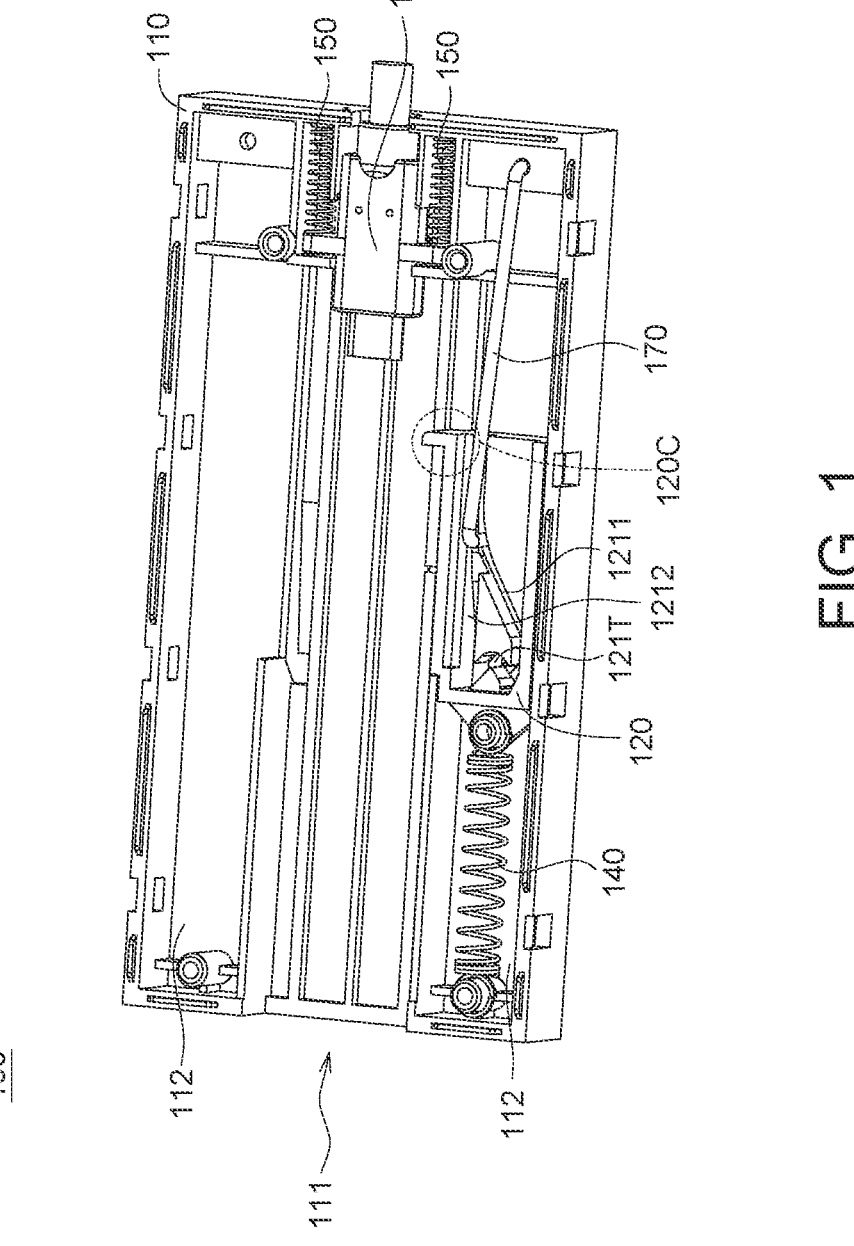
FIG. 1 is a schematic diagram of a receiving device according to an embodiment of the present disclosure.
Figure 2:
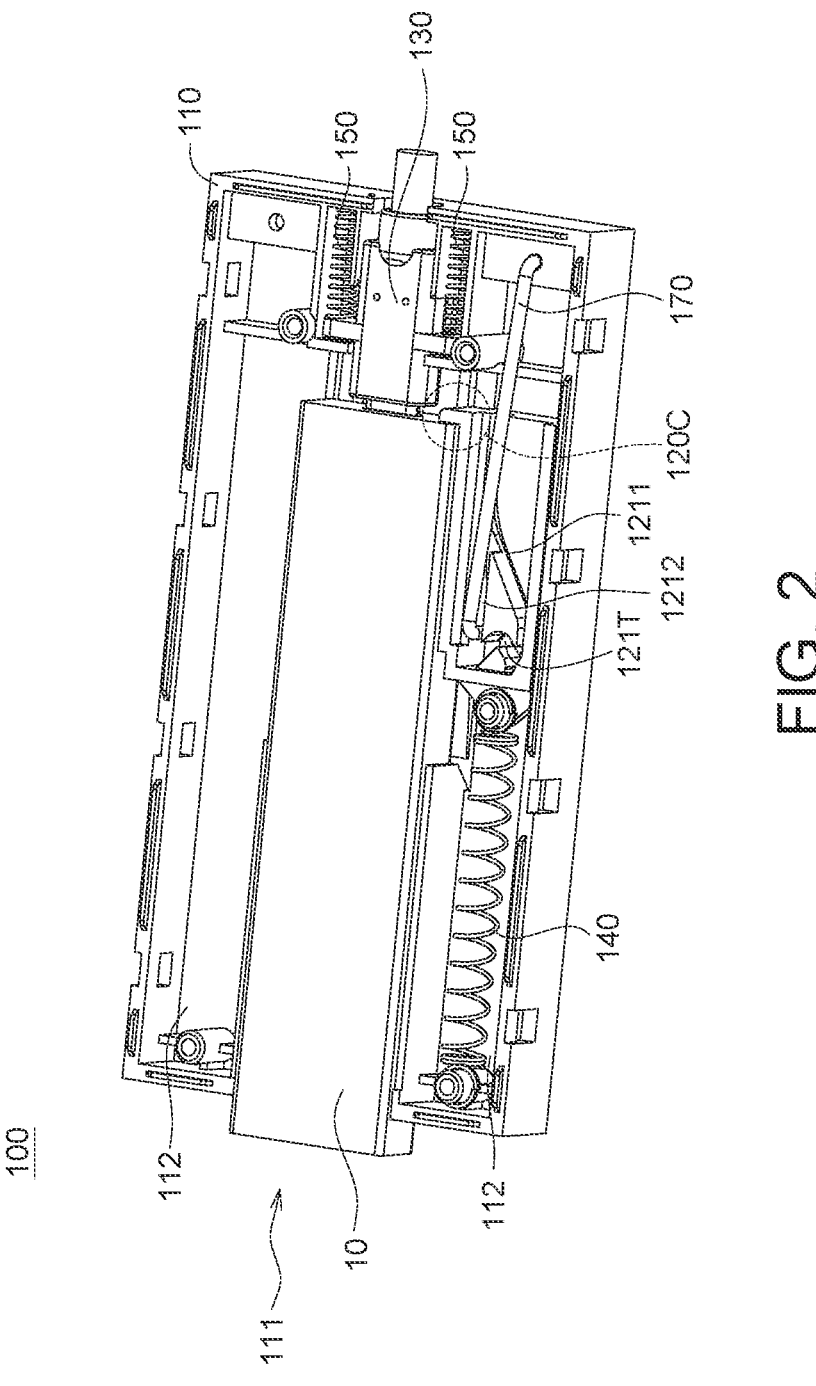
FIG. 2 is a schematic diagram of a receiving device and an external device applicable thereto according to an embodiment of the present disclosure.
Figure 3:
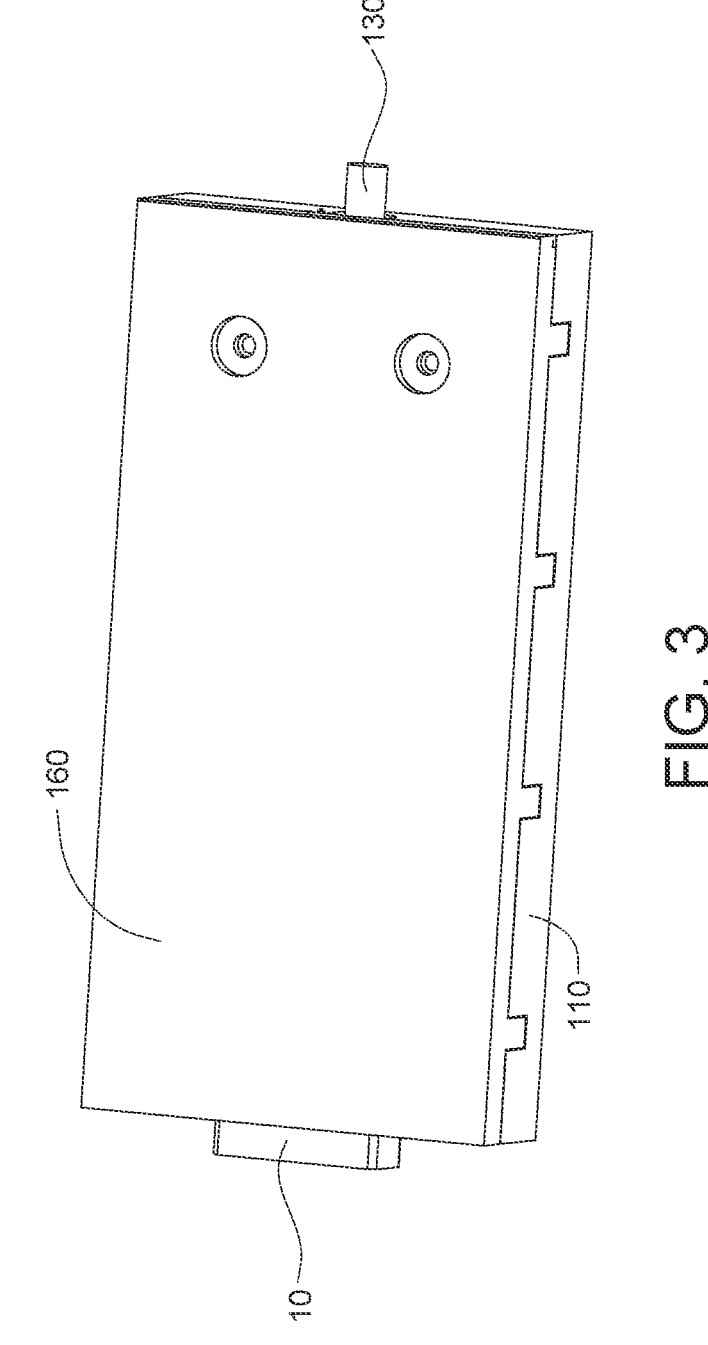
FIG. 3 is a schematic diagram of a receiving device according to an embodiment of the present disclosure.
Figure 4:
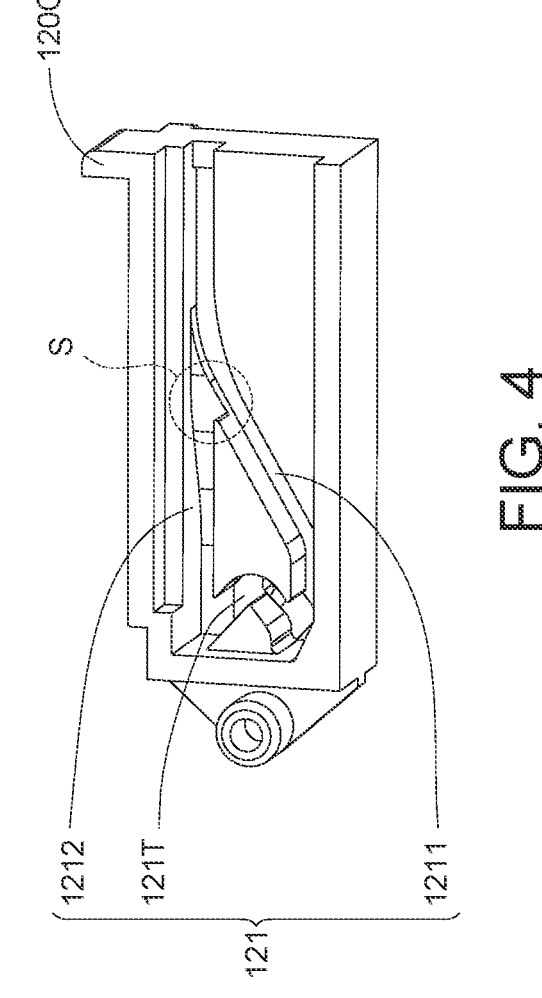
FIG. 4 is a schematic diagram of a slider of a receiving device according to an embodiment of the present disclosure.

Refer to FIG. 1 to FIG. 4. FIG. 1 and FIG. 3 is a schematic diagram of a receiving device 100 according to an embodiment of the present disclosure. FIG. 2 is a schematic diagram of a receiving device 100 and an external device 10 applicable thereto. FIG. 4 is a schematic diagram of a slider 120 of a receiving device 100.

The receiving device 100 provided in the present disclosure can be used to receive an external device 10 with a USB Type-C interface. For instance, the external device 10 can be realized by such as an external hard drive. The receiving device 100 can be installed in a chassis device to provide a function for receiving the external device. As indicated in FIG. 1, the receiving device 100 includes a housing 110, a slider 120, an interface component 130 and a first elastic component 140. The slider 120 is movably arranged on the housing 110. The interface component 130 is disposed on the housing 110. In response to the external device 10 with a USB Type-C interface, the interface component 130 is a USB Type-C interface. The first elastic component 140 is connected between the housing 110 and the slider 120, so that the slider 120 can reciprocally move in the housing 110.

Specifically, the housing 110 includes a receiving track 111 and a sliding groove 112. The receiving track 111 and the sliding groove 112 can be disposed in parallel but are not limited thereto. The slider 120 is movably arranged in the sliding groove 112 and able to move along the extension direction of the sliding groove 112. The first elastic component 140 is connected between one side of the sliding groove 112 and the slider 120. In the present embodiment, the housing 110 includes two sliding grooves 112, and the receiving track 111 is interposed between the two sliding grooves 112.

The receiving track 111 is used to guide the external device 10 to enter the housing 110. The interface component 130 is protruded from a terminal end of the receiving track 111, so that the external device 10 and the interface component 130 can be connected at the receiving track 111. Specifically, in response to the external device 10 entering the housing 110, the slider 120 is contacted by the external device 10 to slide until the external device 10 is connected to the interface component 130. The slider 120 includes a propping structure 120C, which is protruded from the receiving track 111. In response to the external device 10 moves along the receiving track 111, the external device 10 can contact the propping structure 120C and drive the slider 120 to move towards the interface component 130. In response to the external device 10 entering the housing 110, the external device 10 and the interface component 130 are connected; meanwhile, at the part adjacent to the entrance of the receiving track 111, a lateral side of the external device 10 is aligned with a lateral side of the housing 110.

As indicated in FIG. 2, in response to the external device 10 in the housing 110 is pushed by an external force, for instance, in response to the part of the external device 10 adjacent to the entrance of the receiving track 111 is pressed, the first elastic component 140 provides an elastic force to make the slider 120 slide in a reverse direction, the slider 120 pushes against the external device 10 to withdraw the external device 10 from the housing 110. Specifically, the first elastic component 140, which can be realized by such as a tension spring, can provide an elastic restoring force for driving the slider 120 to move towards the entrance of the receiving track 111 and contact the external device 10 through the propping structure 120C, so that the external device 10 can be withdrawn from the housing 110.

The receiving device 100 further includes a second elastic component 150. The second elastic component 150 is connected between the housing 110 and the interface component 130. The second elastic component 150 can be realized by such as a compression spring. In response to the external device 10 presses along the receiving track 111 and connects the interface component 130, the second elastic component 150 can provide an elastic force for stabilizing the connection between the external device 10 and the interface component 130, so that the external device 10 and the interface component 130 will not break away easily. As indicated in FIG. 3, the receiving device 100 further includes a cover 160. The cover 160 is engaged with the housing 110 to cover the slider 120, the interface component 130, the first elastic component 140 and the second elastic component 150. For instance, the cover 160 and the housing 110 can be engaged by way of locking or fastening. One end of the interface component 130 can be partly exposed from the cover 160 and the housing 110 and connected to an interface port of the chassis to implement the interface connection between the external device 10 and the chassis device.

The receiving device 100 further includes a hook component 170.

The hook component 170 is connected between the housing 110 and the slider 120. The hook component 170 can be used to position the slider 120 at different positions of the sliding groove 112. As indicated in FIG. 4, the slider 120 has a track groove 121. The track groove 121 includes a first track structure 1211, a second track structure 1212 and a notch structure 121T. In response to the slider 120 slides, the hook component 170 can move in the track groove 121. The first track structure 1211 and the second track structure 1212 diverge from the diverging point S, so that the track groove 121 is a Y-shaped structure. In the present embodiment, the first track structure 1211 is used where the external device 10 entering the housing 110; the second track structure 1212 is used in response to the external device 10 is withdrawn from the housing 110.

In response to the external device 10 entering the housing 110, the slider 120 moves towards the interface component 130, so that the slider 120 and the hook component 170 move with respect to each other. The hook component 170 can be guided by the wall sides of the track groove 121 to move along the first track structure 1211. In response to the external device 10 entering the housing 110 and being connected to the interface component 130, the hook component 170 can move from the first track structure 1211 to the notch structure 121T and halts there. Specifically, the elastic tension of the first elastic component 140 will pull the slider 120 towards the entrance of the receiving track 111 and the notch structure 121T can provide a position at which the hook component 170 can hook the slider 120 and make the slider 120 be positioned in the sliding groove 112.

In response to the external device 10 is pushed by an external force to dive the slider 120 to move towards the interface component 130, the hook component 170 can be released from the coupling with the notch structure 121T and is guided by the wall sides of the track groove 121, so that the hook component 170 can leave the notch structure 121T and move to the second track structure 1212. That is, in response to the external device 10 is withdrawn from the housing 110, the slider 120 and the hook component 170 will move with respect to each other and the hook component 170 can move along the second track structure 1212, so that the slider 120 can contact the external device 10 through the propping structure 120C to withdraw the external device 10 from the housing 110.

However, this disclosure is not limited to the above embodiments. In another embodiment, the hook component 170 can also be guided by the wall sides of the track groove 121 to move along the second track structure 1212 in response to the external device 10 entering the housing 110, and to move along the first track structure 1211 in response to the external device 10 being withdrawn from the housing 110. Besides, the first track structure 1211 and the second track structure 1212 can have different track lengths, In the present embodiment, the track length of the first track structure 1211 is greater than the track length of the second track structure 1212. In an embodiment, the receiving device 100 can be designed to have another group composed of the slider 120, the first elastic component 140 and the hook component 170 disposed in another sliding groove 112. The two groups are symmetric to each other so that the insertion and withdrawal of the external device 10 can be made more smoothly.

According to the receiving device provided in an embodiment of the present disclosure, through the design of movable actuation of the slider and the elastic component in the housing, the user can easily insert the external device into the receiving device or withdraw the external device from the receiving device, and the operation is made more convenient and effortless. Moreover, through the design of the hook component and the track groove of the slider, the slider can be positioned at different positions of the housing, making the insertion and withdrawal of the external device more convenient.

While the invention has been described by way of example and in terms of the preferred embodiment(s), it is to be understood that the invention is not limited thereto. Based on the technical features embodiments of the present invention, a person ordinarily skilled in the art will be able to make various modifications and similar arrangements and procedures without breaching the spirit and scope of protection of the invention. Therefore, the scope of protection of the present invention should be accorded with what is defined in the appended claims.

What is claimed is:

1. A receiving device, comprising:

a housing;

a slider movably arranged on the housing;

an interface component disposed on the housing;

a first elastic component connected between the housing and the slider; and a second elastic component connected between the housing and the interface component;

wherein, in response to an external device entering the housing, the slider is contacted by the external device to slide until the external device is connected to the interface component, in response to the external device in the housing is pushed by an external force, the first elastic component provides an elastic force to make the slider slide in a reverse direction, and the slider pushes against the external device to withdraw the external device from the housing.

2. The receiving device according to claim 1, wherein the housing comprises a receiving track and a sliding groove, the slider is movably arranged in the sliding groove, the receiving track is used to guide the external device to enter the housing.

3. The receiving device according to claim 2, wherein the receiving track is parallel to an extension direction of the sliding groove.

4. The receiving device according to claim 1, further comprising:

a cover engaged to the housing to cover the slider, the interface component and the first elastic component.

5. The receiving device according to claim 1, further comprising:

a hook component connected between the housing and the slider, wherein the slider has a track groove; in response to the slider slides, the hook component moves in the track groove.

6. The receiving device according to claim 5, wherein the track groove comprises a first track structure and a second track structure; in response to the external device entering the housing, the hook component moves along the first track structure; in response to the external device withdraws from the housing, the hook component moves along the second track structure.

7. The receiving device according to claim 6, wherein the first track structure and the second track structure have different track lengths.

8. The receiving device according to claim 6, wherein the track groove comprises a notch structure; in response to the external device enters the housing and being connected to the interface component, the hook component moves from the first track structure to the notch structure and halts there.

9. The receiving device according to claim 8, wherein in response to the external device is pushed by the external force, the hook component leaves the notch structure and moves to the second track structure.

*    *    *    *    *